United States Patent
Cho et al.

(10) Patent No.: US 7,292,440 B2
(45) Date of Patent: Nov. 6, 2007

(54) HEAT DISSIPATING SHEET AND PLASMA DISPLAY DEVICE INCLUDING THE SAME

(75) Inventors: In-Soo Cho, Seongnam-si (KR); Sok-San Kim, Cheonan-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 456 days.

(21) Appl. No.: 10/929,442

(22) Filed: Aug. 31, 2004

(65) Prior Publication Data

US 2005/0052358 A1    Mar. 10, 2005

(30) Foreign Application Priority Data

Sep. 9, 2003    (KR)    ................. 10-2003-0063412

(51) Int. Cl.
*H05K 7/20*    (2006.01)
(52) U.S. Cl. .............. 361/704; 361/705; 361/707; 165/185; 428/297.4
(58) Field of Classification Search ............. None
See application file for complete search history.

(56) References Cited

U.S. PATENT DOCUMENTS

| | | | |
|---|---|---|---|
| 5,541,618 A | | 7/1996 | Shinoda |
| 5,649,593 A | * | 7/1997 | Yamaguchi et al. ........ 165/185 |
| 5,661,500 A | | 8/1997 | Shinoda et al. |
| 5,663,741 A | | 9/1997 | Kanazawa |
| 5,674,553 A | | 10/1997 | Sinoda et al. |
| 5,724,054 A | | 3/1998 | Shinoda |
| 5,786,794 A | | 7/1998 | Kishi et al. |
| 5,949,650 A | * | 9/1999 | Bulante et al. ............. 361/704 |
| 5,952,782 A | | 9/1999 | Nanto |
| 5,962,348 A | * | 10/1999 | Bootle et al. ............... 442/265 |
| 5,971,566 A | * | 10/1999 | Tani et al. .................. 362/294 |
| RE37,444 E | | 11/2001 | Kanazawa |

(Continued)

FOREIGN PATENT DOCUMENTS

JP    02-148645    6/1990

(Continued)

OTHER PUBLICATIONS

Korean Office Action issued by the Korean Patent Office in applicant's corresponding Korean Patent Application No. KR 10-2003-0063412, issued on Jul. 25, 2005.

(Continued)

*Primary Examiner*—Boris Chèrvinsky
(74) *Attorney, Agent, or Firm*—Robert E. Bushnell, Esq.

(57) ABSTRACT

A plasma display device entirely distributes the temperature of a heat generator, and improves the detachability of a heat dissipating sheet and coherence with the heat generator. The plasma display device includes a plasma display panel for displaying an image, a chassis base disposed to face the plasma display panel, and a heat dissipating sheet disposed between the plasma display panel and the chassis base and including a resin material and carbon fibers fixed in the resin material. Preferably, the carbon fibers are intensively impregnated in a center portion of the resin material toward the display panel, and are arranged at least in one direction parallel to the display panel, or in different directions with respect to each other and separated from each other by the resin material.

22 Claims, 5 Drawing Sheets

U.S. PATENT DOCUMENTS

| | | | |
|---|---|---|---|
| 6,451,418 B1 * | 9/2002 | Tobita | 428/297.4 |
| 6,630,916 B1 | 10/2003 | Shinoda | |
| 6,707,436 B2 | 3/2004 | Setoguchi et al. | |
| 6,815,084 B1 * | 11/2004 | Scott et al. | 428/611 |
| 6,837,306 B2 * | 1/2005 | Houle et al. | 165/185 |
| 6,965,513 B2 * | 11/2005 | Montgomery et al. | 361/687 |
| 7,112,472 B2 * | 9/2006 | Dubin | 438/122 |
| 2002/0038704 A1 * | 4/2002 | Houle et al. | 165/185 |
| 2004/0018375 A1 * | 1/2004 | Banno et al. | 428/605 |
| 2004/0241417 A1 * | 12/2004 | Fischer et al. | 428/317.9 |
| 2005/0068738 A1 * | 3/2005 | Kim et al. | 361/704 |

FOREIGN PATENT DOCUMENTS

| | | |
|---|---|---|
| JP | 06-216285 | 8/1994 |
| JP | 2845183 | 10/1998 |
| JP | 2917279 | 4/1999 |
| JP | 2001-043804 | 2/2001 |
| JP | 2001-325888 | 11/2001 |
| KR | 10-2001-0051709 A | 6/2001 |
| WO | WO 2007013705 A1 * | 2/2007 |

OTHER PUBLICATIONS

*"Final Draft International Standard"*, Project No. 47C/61988-1/Ed.1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

* cited by examiner

HEAT DISSIPATING SHEET AND PLASMA DISPLAY DEVICE INCLUDING THE SAME

CLAIM OF PRIORITY

This application makes reference to, incorporates the same herein, and claims all benefits accruing under 35 U.S.C. §119 from an application for HEAT DISSIPATING SHEET AND PLASMA DISPLAY DEVICE INCLUDING THE SAME earlier filed in the Korean Intellectual Property Office on 9 Sep. 2003 and there duly assigned Serial No. 2003-63412.

BACKGROUND OF THE INVENTION

1. Technical Field

The present invention relates to a heat dissipating sheet and a plasma display device including the same and, more particularly, to a heat dissipating sheet that has an improved structure such that a temperature distribution of a heating element is uniform and which can be easily attached/separated to/from a plasma display device, and a plasma display device including the heat dissipating sheet.

2. Description of the Related Art

A plasma display device is a flat display device that displays an image using a gas discharging phenomenon. The plasma display device has good displaying characteristics, such as display capacity, brightness, contrast, after-image, and viewing angle. Also, the plasma display device can display on a large screen with a thin main body, and it is thus considered to be a display device of the next generation and a replacement for the cathode ray tube (CRT) device.

The plasma display device includes a plasma display panel (PDP) which includes a front panel and a back panel, a chassis base, a back surface which includes a circuit unit for driving the PDP, and a heat dissipating sheet disposed between the PDP and the chassis base.

Since the plasma display device uses a discharging operation for displaying images, the panel which displays images generates a lot of heat.

Conventionally, the heat dissipating sheet is manufactured using a resin composition mixed with thermal conductive filler, such as copper powder, graphite powder or aluminum powder.

However, the heat dissipating sheet with the above structure has a low thermal conductive coefficient of about 1 W/mK, and thus it has a weak heat dissipating function. Especially, when heat dissipation in the panel plane direction is not sufficient, the uneven temperature distribution due to the discharging intensity cannot be eliminated promptly. Thus, brightness is lowered at the discharging cell, in which more heat accumulates, and this results in an after-image, which is the brightness difference between a discharging cell and a non-discharging cell. As a result, the brightness of the entire PDP is lowered. Moreover, when the discharging strength is raised to improve the brightness of the plasma display device, the panel generates more heat.

In addition, if the temperature is distributed unevenly on a panel that is manufactured using glass material, durability of the panel is lowered and the panel may crack due to temperature stress.

In order to improve the uneven temperature distribution and thermal conductive function, a high thermal conductive heat dissipating sheet made of high oriented graphite is used. However, such a high thermal conductive heat dissipating sheet has poor adherence with a panel which is manufactured using glass material, and thus the heat dissipating function is lowered.

In addition, the high thermal conductive heat dissipating sheet has weak coherence between particles due to the characteristic of the material, and this can cause a brittle fracture problem due to weak flexibility thereof.

Moreover, if the heat dissipating sheet is removed in order to repair the PDP, some of the heat dissipating sheet may remain on the panel, thus requiring additional manual work.

Japanese Laid-open Patent No. hei 6-216285 discloses another example for improving the heat dissipating function. It discloses a heat dissipating sheet manufactured using a thermal conductive woven fabric. The thermal woven fabric is woven using carbon fibers, and the fabric is disposed between a heat generating body, such as an electric or electronic element, and a heat sink to dissipate the heat generated by the heat generating body.

However, the heat generating body and the heat sink may include a non-planar portion, and may include a distorted portion due to the heat generated by the heat generating body. If the flatness of the heat generating body and of the heat sink is lowered due to the non-planar portion or the distorted portion, the heat dissipating sheet cannot be closely adhered between the heat generating body and the heat sink. In addition, according to the conventional art, a unit for preventing inferior coherence is not provided, thus lowering the heat dissipating function.

Moreover, the heat dissipating sheet woven by the carbon fiber includes a bent portion where the carbon fibers cross each other, and thus the flatness is lowered due to the bent portion. Also, since the carbon fiber is strained and the stress is concentrated in the bent portion, the flexibility of the fabric is lowered and the coherence of the heat dissipating sheet is degraded.

SUMMARY OF THE INVENTION

The present invention provides a heat dissipating sheet in which temperature of a heat generating body is distributed evenly, and a plasma display device including the heat dissipating sheet.

The present invention also provides a heat dissipating sheet having improved coherence with a heat generating body, and a plasma display device including the heat dissipating sheet.

The present invention also provides a heat dissipating sheet having improved detachability, and a plasma display device including the heat dissipating sheet.

According to an aspect of the present invention, there is provided a plasma display device including: a plasma display panel for displaying an image; a chassis base disposed to face the plasma display panel; and a heat dissipating sheet disposed between the plasma display panel and the chassis base, and including a resin material and carbon fibers fixed in the resin material.

The carbon fibers are, preferably, impregnated in the resin material, and especially, the carbon fibers are intensively impregnated in the resin material toward the plasma display panel. Moreover, the carbon fibers are, preferably, impregnated in a center portion of the thickness of the resin material.

The carbon fibers are arranged at least in one direction that is parallel with the plasma display panel.

The carbon fibers are arranged in different directions with respect to each other, and they contact each other. Otherwise, the carbon fibers are arranged in different directions with respect to each other, and are separated from each other by the resin material.

According to another aspect of the present invention, there is provided a plasma display device including: a plasma display panel for displaying an image; a chassis base disposed to face the plasma display panel; and a heat dissipating sheet disposed between the plasma display panel and the chassis base, and including a resin material and carbon nano tube powder mixed in the resin material.

According to still another aspect of the present invention, there is provided a heat dissipating sheet installed on a heat generator for dissipating heat, the heat dissipating sheet including a resin material and carbon fibers fixed in the resin material.

The carbon fibers are, preferably, impregnated in the resin material, and especially, the carbon fibers are intensively impregnated in the resin material toward the heat generator. Also, the carbon fibers are, preferably, impregnated in a center portion of the thickness of the resin material.

The carbon fibers are arranged at least in one direction that is parallel with the plasma display panel. In that case, the carbon fibers are arranged in different directions with respect to each other, and they contact each other, or the carbon fibers are arranged in different directions with respect to each other, and are separated from each other by the resin material.

According to yet still another aspect of the present invention, there is provided a heat dissipating sheet installed on a heat generator for dissipating heat, the heat dissipating sheet including a resin material and carbon nano tube powder mixed in the resin material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
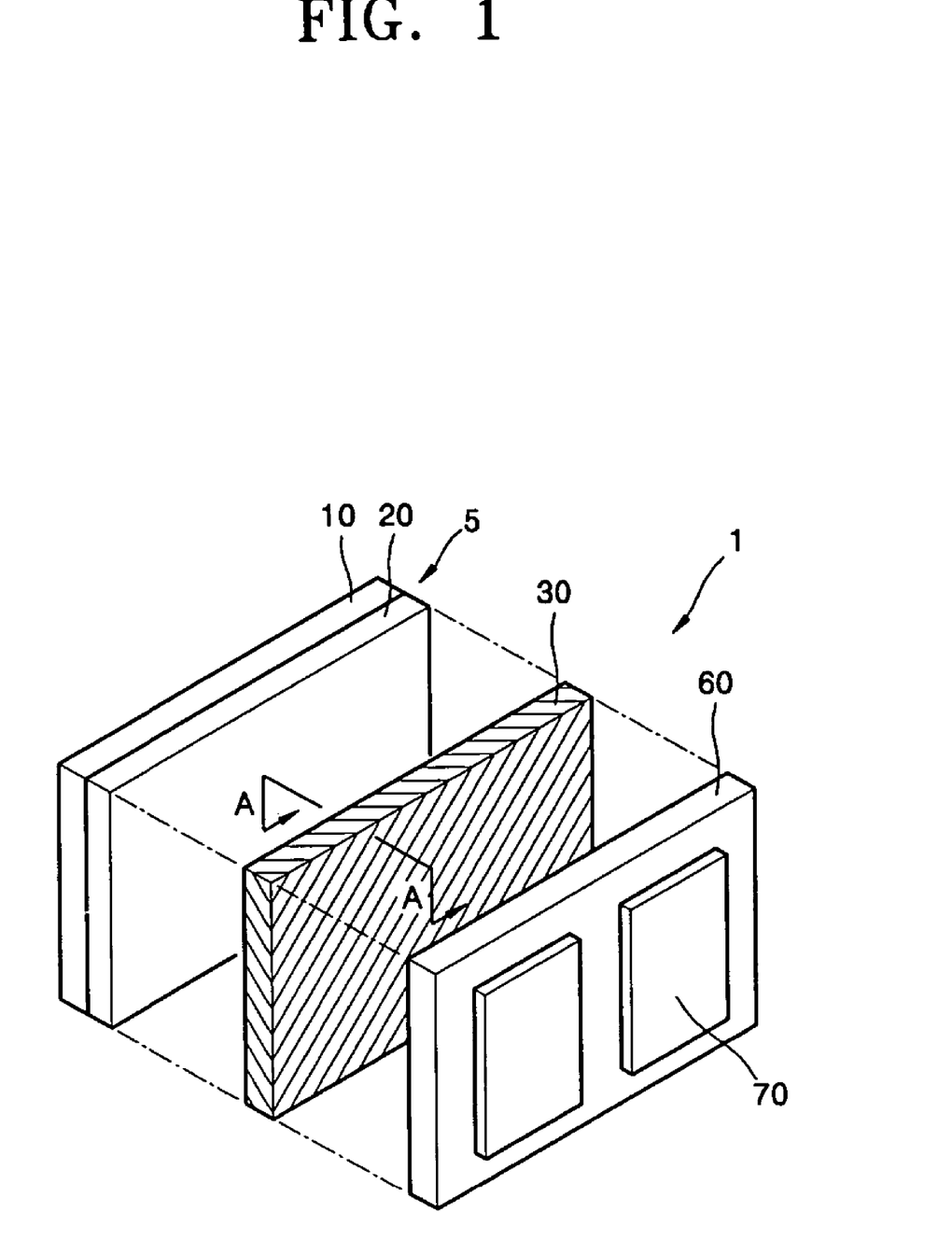
FIG. 1 is an exploded perspective view of a heat dissipating sheet according to the present invention, and a plasma display device including the heat dissipating sheet.
Figure 2:
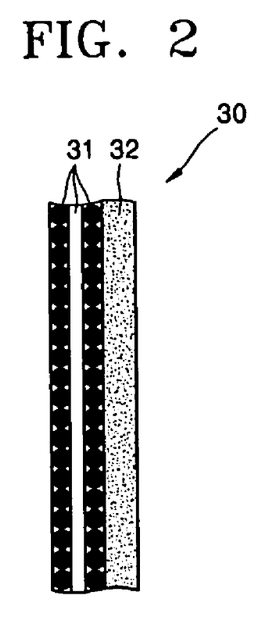
FIG. 2 is a cross-sectional view taken along line A-A in FIG. 1.
Figure 3:
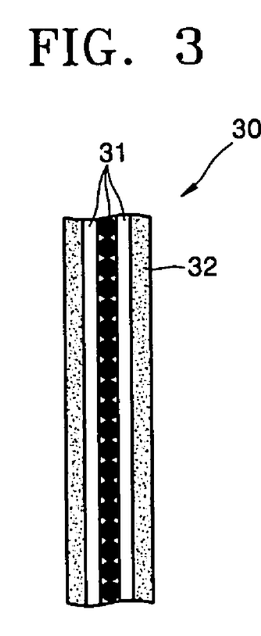
FIGS. 3 through 5 are cross-sectional views of heat dissipating sheets according to embodiments of the present invention.
Figure 4:
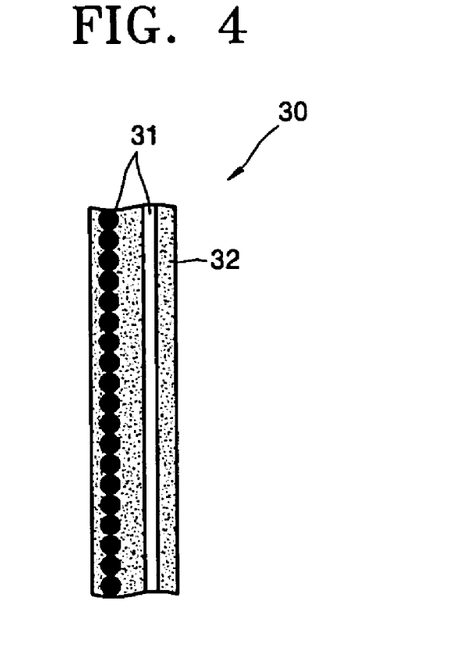
Figure 5:
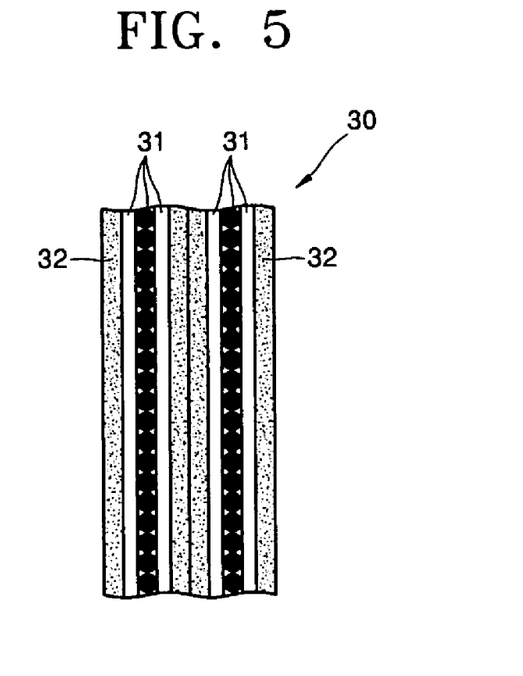

FIG. 1 is an exploded perspective view of a heat dissipating sheet according to a preferred embodiment of the present invention, and a plasma display device including the heat dissipating sheet, and FIG. 2 is a cross-sectional view taken along line A-A in FIG. 1. FIGS. 3 through 5 are cross-sectional views of heat dissipating sheets according to various embodiments of the present invention.

Referring to FIG. 1, the plasma display device 1 includes a plasma display panel (PDP) 5, a chassis base 60, a circuit unit 70, and a heat dissipating sheet 30 disposed between the PDP 5 and the chassis base 60.

The PDP 5 is formed by coupling a front panel 10 and a back panel 20. The PDP 5 is manufactured using glass material, and constitutes an image displaying unit which displays images using a discharging operation.

The chassis base 60 is manufactured using a material having high thermal conductivity, such as aluminum, and it performs as a heat dissipating plate which performs a heat dissipating operation with respect to the PDP 5 and the circuit unit 70.

The circuit unit 70 drives the PDP 5, and is installed on a rear side of the chassis base 60.

The heat dissipating sheet 30 is disposed between the PDP 5 and the chassis base 60, and, as seen in FIG. 2, the heat dissipating sheet 30 includes carbon fibers 31 and a resin material 32. As also shown in FIG. 2, the carbon fibers 31 are arranged in two different directions with respect to each other, and the carbon fibers 31 arranged in the two different directions with respect to each other are stacked alternately. In addition, the stacked carbon fibers are concentrated on one side of a resin material 32, and are impregnated in the resin material 32.

Polyacrylonitrile (PAN)-based carbon fiber or pitch-based carbon fiber, obtained when a material such as coal tar is distilled, can be used as the carbon fibers 31.

The carbon fibers 31 have an anisotropic feature, that is, crystal lattices of the carbon fibers 31 are arranged in a lengthwise direction, and are stacked in a width direction thereof. As such, the carbon fibers 31 have high thermal conductivity in the lengthwise direction. Therefore, in order to improve the temperature distribution in the panel, it is desirable that the carbon fibers 31 be arranged in parallel on the PDP 5, and be concentrated toward the PDP 5.

Moreover, it is desirable that the carbon fibers 31 be arranged in various directions with the same angles between each other. In the heat dissipating sheet 30 shown in FIG. 2, the carbon fibers 31 are arranged in two different directions which cross each other orthogonally so that the generated heat can be evenly diffused throughout the entire surface of the PDP 5.

A thermosetting resin, such as epoxy resin, can be used as the resin material 32, and the resin material 32 functions as a binder which fixes the carbon fibers 31. Thus, as shown in FIG. 2, the carbon fibers 31 do not need to be woven, but can be fixed by the resin material 32.

The resin material 32 also functions as a buffer layer. That is, the chassis base 60 generally has a nonplanar portion due to limitations of the fabrication process. Also, the PDP 5 or the chassis base 60 can be distorted by heat generated in the PDP 5. In this case, the resin material 32 can make the heat dissipating sheet 30 adhere to the nonplanar portion of the distorted portion.

As shown in FIG. 3, the carbon fibers 31 can be arranged on a center portion of the resin material without being concentrated on one side. In this case, the carbon fibers 31 can be fully impregnated in the resin material 32, and can be fixed firmly.

Moreover, as shown in FIG. 4, in the heat dissipating sheet 30, the carbon fibers 31 are arranged in the different directions with respect to each other, and are separated by the resin material 32. When thermal conductive filler (not shown), such as graphite powder or aluminum powder, is included in the resin material 32, the thermal conductivity of the heat dissipating sheet 30 in the thickness direction thereof can be improved.

As shown in FIG. 5, the heat dissipating sheet 30 may have a multi-layer structure, in which combination layers including the carbon fibers 31 and the resin material 32 are stacked.

Next, the processes of manufacturing the heat dissipating sheet 30 will be described with reference to FIGS. 6A through 6C.

Figure 6A:
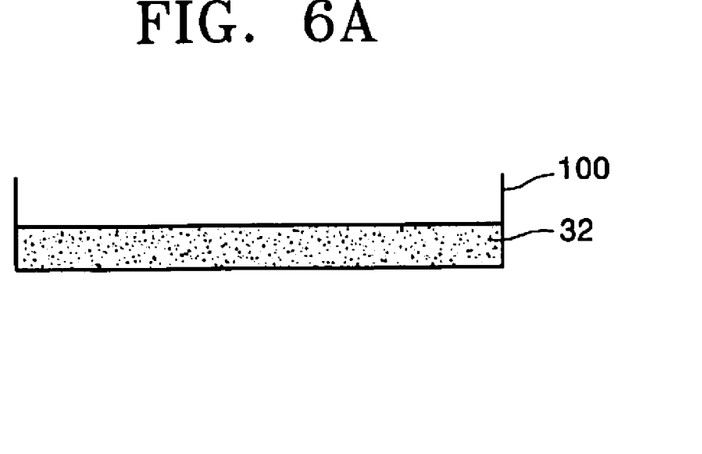
FIGS. 6A through 6C, 7A and 7B are views illustrating a process of manufacturing the heat dissipating sheet.
Figure 6B:
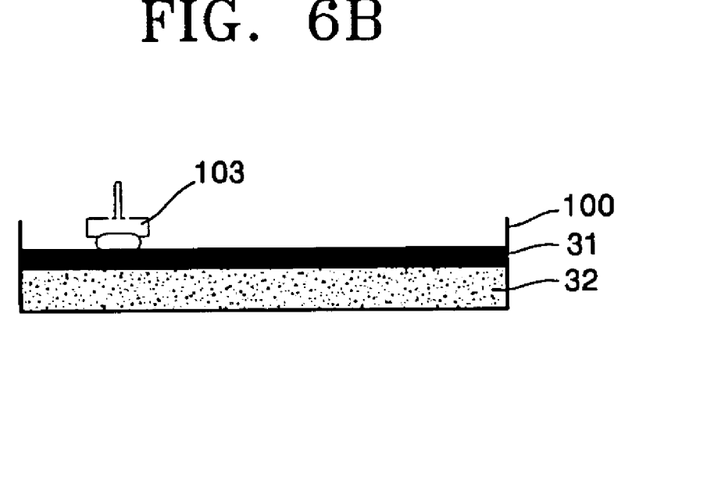
Figure 6C:
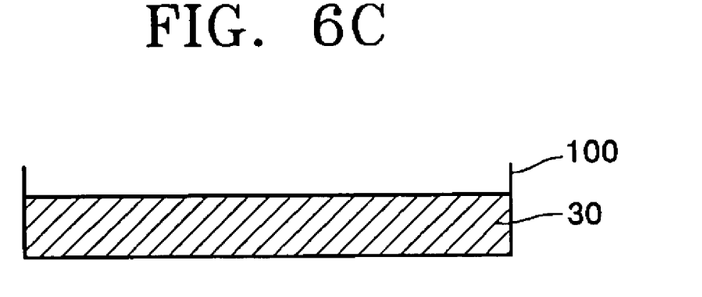

As an example of the resin material 32, epoxy resin is filled in a mold 100 so as to correspond to the thickness of the heat dissipating sheet, and is hardened for a predetermined time (FIG. 6A). Carbon fibers 31 are stacked on the hardened resin material 32, and the stacked carbon fibers 31 are compressed using a roller 103 to fix the carbon fibers 31 in the resin material 32 (FIG. 6B). In addition, hardening and releasing operations are performed, and then the manufacturing of the heat dissipating sheet 30 is completed (FIG. 6C).

The degree of hardening of the resin material is differentiated to manufacture the heat dissipating sheet 30, including the carbon fibers 31 concentrated on one side of the resin material 32, and to manufacture the heat dissipating sheet 30, including the carbon fibers 31 disposed on the center portion of the resin material 32. For example, when the carbon fibers 31 are disposed on the center portion of the resin material 32, the degree of hardening of the resin material 32 is lowered so as to infiltrate the carbon fibers 31 into the lower portion of the resin material 32.

Figure 7A:
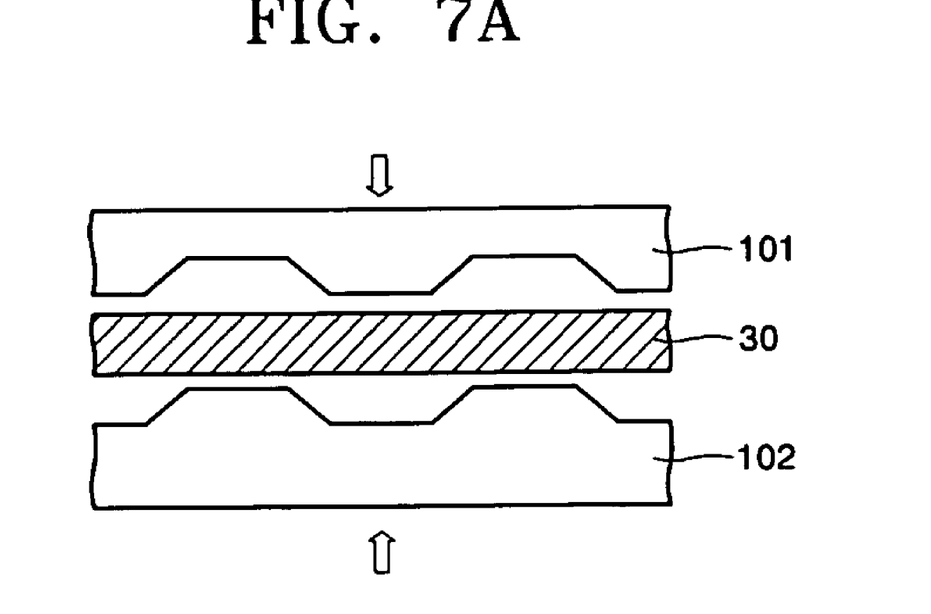
Figure 7B:
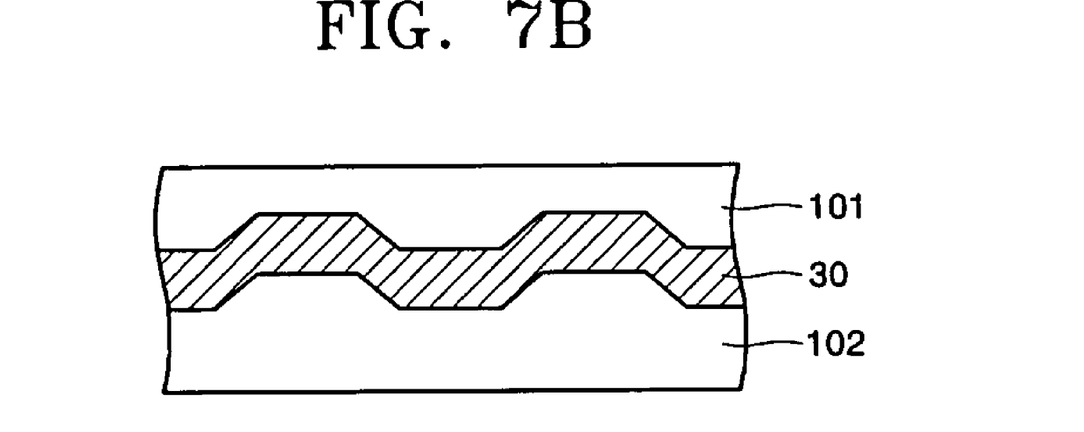

In order to form the heat dissipating sheet 30 in other shapes, besides the flat plate structure, a combination layer including the carbon fibers 31 and the resin material 32 is interposed between an upper die 101 and a lower die 102 in a half-hardened state, and is compressed to form the required shape, as shown in FIGS. 7A and 7B.

In order to manufacture the heat dissipating sheet 30 by stacking the combination layers, including the carbon fibers 31 and the resin material 32, the above processes are repeated to stack the combination layers.

When the heat dissipating sheet 30, including the carbon fibers 31, is used in a plasma display device, the following effects can be obtained.

The carbon fibers 31 having high thermal conductivity in the lengthwise direction are arranged in parallel with the PDP 5, thus providing a heat dissipating operation toward the plane. Therefore, the temperature difference in the PDP 5, caused by the difference of discharging strength for gray level, can be eliminated rapidly, and any after-image effect can be reduced or eliminated.

Also, the thermal stress generated by the temperature difference is eliminated so as to prevent the PDP 5 fabricated by glass material from being damaged and to improve the durability of the PDP 5.

Moreover, if the temperature is distributed evenly in the PDP 5, the heat can be transmitted evenly to the chassis base 60, and the entire heat dissipating efficiency can be improved.

The coherence of the heat dissipating sheet 30 with the PDP 5 can be improved by compressing the heat dissipating sheet 30. In particular, the coherence of the heat dissipating sheet 30 of the present invention is higher than that of the conventional heat dissipating sheet manufactured using carbon fiber woven fabric, thus improving the heat dissipating function of the plasma display device 1. That is, since the heat dissipating sheet 30 includes resin material 32 which functions as a buffer layer, the heat dissipating sheet 30 can be adhered to the nonplanar portion or the distorted portion of the chassis base 60 or the PDP 5.

Also, according to the present invention, since carbon fibers 31 do not need to be woven to have a fabric form, but are fixed in the resin material 32, bending at the positions where the carbon fibers 31 cross each other can be eliminated. Therefore, the flatness of the heat dissipating sheet 30 is improved.

Moreover, if the bending of the carbon fibers 31 eliminated, distortion or stress concentration that may be generated at the bent portion can be prevented, thus improving the flexibility of the sheet 30. Therefore, the heat dissipating sheet 30 can be adhered to the PDP 5 easily through a compressing junction process.

On the other hand, according to the present invention, detachability of the heat dissipating sheet 30 adhered to the PDP 5 is improved, thus reducing the processes and improving the yield of the product. That is, when the heat dissipating sheet 30 is separated from the PDP 5 for the purpose of repairing the PDP 5, the heat dissipating sheet 30 can be entirely and easily separated, and thus additional manual work is not required and dust is not generated.

In the heat dissipating sheet 30 of the present invention, the shapes of the carbon fibers 31 fixed by the resin material 32 do not need to be limited. Thus, the carbon fibers 31 can be provided in fabric form, and the fabric is fixed by the resin material 32 so as to manufacture the heat dissipating sheet 30 of the present invention.

The heat dissipating sheet 30, according to another aspect of the present invention, includes resin material 32 and carbon nano tube included in the resin material. In this case, the heat dissipating sheet 30 maybe manufactured by mixing the resin material 32 with carbon nano tubes in powder form.

The carbon nano tube can be fabricated in various ways, such as by the arc-discharge method, the laser vaporization method, the chemical vapor deposition method, the vapor phase growth method, and the ionization method. The chemical vapor deposition method may include a thermal chemical vapor deposition method or a plasma chemical vapor deposition method. According to the chemical vapor deposition method, a transition metal is deposited on a deposition surface as a catalyst so as to grow the carbon nano tubes, and the carbon nano tubes are grown on the deposition surface.

The carbon nano tubes have an anisotropic thermal conductivity, that is, the thermal conductivities in various directions are different from each other, and the highest thermal conductivity in the axial direction of the tube is about 3000~6000 W/mK under room temperature. The carbon nano tubes having a high thermal conductivity can improve the heat dissipating function of the heat dissipating sheet 30.

The resin material 32 functions as a binder of the carbon nano tube powder, and resin material of the epoxy group or silicon group can be used as the resin material 32. The resin material 32 is flexible so that the heat dissipating sheet 30 can be adhered between the PDP 5 and the chassis base 60.

The heat dissipating sheet 30 can be fabricated by mixing the resin material 32 with the carbon nano tube powder, and hardening and forming the mixture.

The heat dissipating sheet 30 has an isotropic thermal conductive characteristic since the carbon nano tube powder of an anisotropic thermal conductivity is distributed irregularly when it is mixed in the resin material 32. The heat dissipating sheet 30 has a thermal conductivity of about 10 W/mK.

The thermal conductivity is determined by the content of the carbon nano tube that is used as the thermal transmitting filler. When a very small amount of resin material 32 is used as a binder, the thermal conductivity of the heat dissipating sheet 30 is improved to about 200~900 W/mK.

As described above, when the heat dissipating sheet 30 is manufactured using carbon nano tube having higher thermal conductivity, the display quality including the brightness can be improved, and durability of the elements can be improved.

Whereas a preferred embodiment of the plasma display device of the present invention is described herein, the features of the present invention are not limited thereto, but can be applied to all kinds of applicable heat generators.

According to the present invention, the temperature distribution with respect to the heat generator can be improved evenly. That is, in the heat dissipating sheet 30, the carbon fibers having high thermal conductivity in the lengthwise direction are arranged in parallel with the heat generator, for example, the plasma display panel, thus bringing about heat dissipation in the plane direction, and the temperature can be distributed evenly throughout the PDP 5.

Thus, in the plasma display device, the after-image effect can be reduced or eliminated. In addition, heat stress caused by an uneven temperature distribution is eliminated, thus preventing a panel of glass material from being damaged and improving the durability of the panel.

Moreover, if the temperature is distributed evenly within the panel, the heat can be transmitted evenly to the chassis base, and the entire heat dissipating efficiency can be improved.

The coherence of the heat dissipating sheet 30 and the panel 5 can be improved by compressing the heat dissipating sheet 30, and especially, the coherence is higher than the conventional heat dissipating sheet manufactured using carbon fiber woven fabric, thus improving the heat dissipating function.

That is, the heat dissipating sheet 30 can include the resin material 32 functioning as a buffer layer, and the heat dissipating sheet can be adhered to the nonplanar portion or distorted portion of the chassis base 60 or the panel 5 (FIG. 1).

Also, according to the present invention, the carbon fibers 31 (FIG. 2) do not need to be woven in fabric form, but are fixed by the resin material 32 in a simply arranged state. Thus, bending at the crossed section can be eliminated. Therefore, the flatness of the heat dissipating sheet 30 can be improved, thus improving the coherence of the heat dissipating sheet 30.

If bending in the heat dissipating sheet 30 is eliminated, the distortion or stress concentration which may be generated at the bent portion can be eliminated as well, thus improving the flexibility of the sheet 30. Therefore, the heat dissipating sheet 30 can be adhered to the plasma display panel 5 by compression.

When the detachability of the heat dissipating sheet 30 is improved, the number of operations in the manufacturing process can be reduced, and the yield of the process can be improved. For example, when the heat dissipating sheet 30 is separated from the panel 5 for repairing the panel, the heat dissipating sheet 30 can be entirely separated, and thus additional manual work is not required and dust is not generated.

According to another aspect of the present invention, the heat dissipating sheet 30 includes carbon nano tube having high thermal conductivity and is disposed to improve the heat dissipating efficiency of the heat generator, for example, the plasma display panel 5, and to improve the temperature distribution evenly. Therefore, display quality including brightness is improved, and the durability of elements can be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display device, comprising:
   a plasma display panel for displaying an image;
   a chassis base disposed to face the plasma display panel; and
   a heat dissipating sheet disposed between the plasma display panel and the chassis base, and including a resin material and carbon fibers fixed in the resin material,
   wherein the carbon fibers are arranged along at least two different directions relative to each other, and are entirely separated from each other by the resin material.

2. The plasma display device of claim 1, wherein the resin material is an epoxy resin.

3. The plasma display device of claim 1, wherein the carbon fibers are impregnated in the resin material.

4. The plasma display device of claim 3, wherein the carbon fibers are impregnated in the resin material toward the plasma display panel.

5. The plasma display device of claim 3, wherein the carbon fibers are impregnated in a center portion of a thickness of the resin material.

6. The plasma display device of claim 1, wherein the carbon fibers are arranged at least in one direction that is parallel with the plasma display panel.

7. The plasma display device of claim 6, wherein the carbon fibers contact each other.

8. A plasma display device, comprising:
   a plasma display panel for displaying an image;
   a chassis base disposed to face the plasma display panel; and
   a heat dissipating sheet disposed between the plasma display panel and the chassis base, and including a resin material and carbon nano tube powder mixed in the resin material.

9. A heat dissipating sheet installed at a heat generator for dissipating heat, the heat dissipating sheet comprising:
   a resin material; and
   carbon fibers fixed in the resin material;
   wherein the carbon fibers are arranged along at least two different directions relative to each other, and are entirely separated from each other by the resin material.

10. The heat dissipating sheet of claim 9, wherein the resin material is an epoxy resin.

11. The heat dissipating sheet of claim 9, wherein the carbon fibers are impregnated in the resin material.

12. The heat dissipating sheet of claim 11, wherein the carbon fibers are impregnated in the resin material toward the heat generator.

13. The heat dissipating sheet of claim 11, wherein the carbon fibers are impregnated in a center portion of a thickness of the resin material.

14. The heat dissipating sheet of claim 9, wherein the heat dissipating sheet heat in a plasma display panel, and the carbon fibers are arranged at least in one direction which is parallel with the plasma display panel.

15. The heat dissipating sheet of claim 14, wherein the carbon fibers contact each other.

16. The plasma display device of claim 8, wherein the resin material is an epoxy resin.

17. The plasma display device of claim 8, wherein the carbon nanotube powder is impregnated in the resin material toward a plasma display panel of the plasma display device.

18. The plasma display device of claim 8, wherein the carbon nanotube powder is impregnated in a center portion of a thickness of the resin material.

19. A heat dissipating sheet installed at a heat generator for dissipating heat, the heat dissipating sheet comprising:
a resin material; and
carbon nano tube powder mixed in the resin material.

20. The heat dissipating sheet of claim 19, wherein the resin material is an epoxy resin.

21. The heat dissipating sheet of claim 19, wherein the carbon nanotube powder is impregnated in the resin material toward the heat generator.

22. The heat dissipating sheet of claim 19, wherein the carbon nanotube powder is impregnated in a center portion of a thickness of the resin material.

* * * * *